United States Patent [19]

Young et al.

[11] 4,308,593
[45] Dec. 29, 1981

[54] INTERCHANGEABLE MAGNETIC BUBBLE MEMORY

[75] Inventors: B. Arlen Young, Palo Alto; James S. Toreson, Mountain View, both of Calif.

[73] Assignee: Microcomputer Systems Corporation, Sunnyvale, Calif.

[21] Appl. No.: 38,444

[22] Filed: May 14, 1979

[51] Int. Cl.³ .................. G11C 19/08; G11C 7/00
[52] U.S. Cl. .................................... 365/15; 365/1
[58] Field of Search .................... 365/15, 1, 2

[56] References Cited

U.S. PATENT DOCUMENTS

| 4,070,651 | 1/1978 | Naden | 365/15 |
| 4,090,251 | 5/1978 | Flannigan et al. | 365/15 |
| 4,156,934 | 5/1979 | Burford et al. | 365/2 |

OTHER PUBLICATIONS

IEEE Transactions on Magnetics–vol. Mag-13, No. 5, Sep. 1977, pp. 1631-1635.
Electronics–Apr. 26, 1979, pp. 105-111.
Computer–vol. 10, No. 8, Aug. 1977, pp. 74-81.

Primary Examiner—James W. Moffitt
Attorney, Agent, or Firm—Flehr, Hohbach, Test, Albritton & Herbert

[57] ABSTRACT

An interchangeable magnetic bubble memory device having first and second interchangeable memory bubbles, each of the modules including a magnetic bubble memory having at least one major loop or non-recirculating track, each major loop or track including a plurality of minor loops for storing magnetic bubbles. There are no more than n defective minor loop locations indicated by an error map. A detector produces data signals indicating the presence or absence of magnetic bubbles in the minor loops and a microprocessor provides control signals for controlling the transfer of the data signals between the data memory and the microprocessor. A driver is included and is responsive to the enable control signals from the microprocessor for transferring, replicating, generating and/or destroying the bubbles with low power consumption. A control store is provided for storing error map instructions for encoding the error map such that the modules can be interchanged regardless of the locations of the defective minor loops in each of the modules.

27 Claims, 7 Drawing Figures

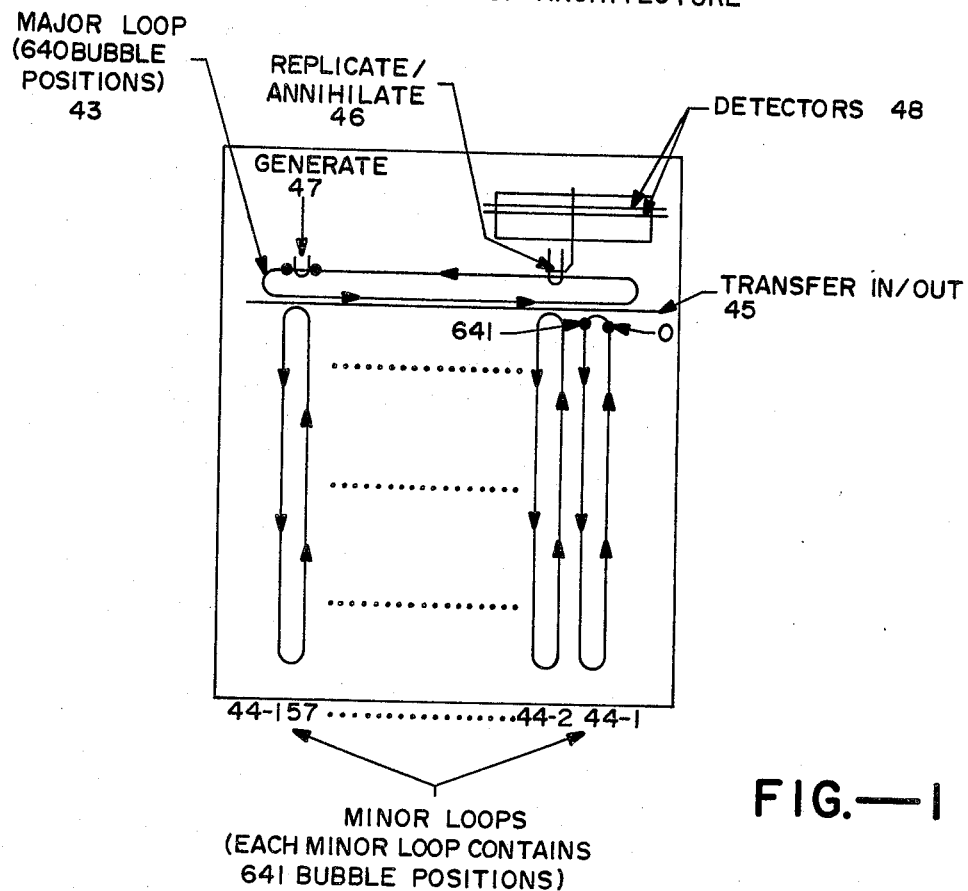
FIG.—1
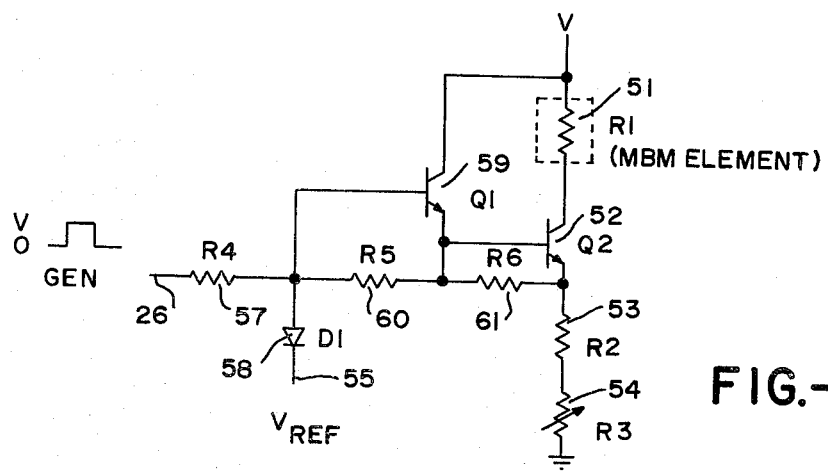
FIG.—4

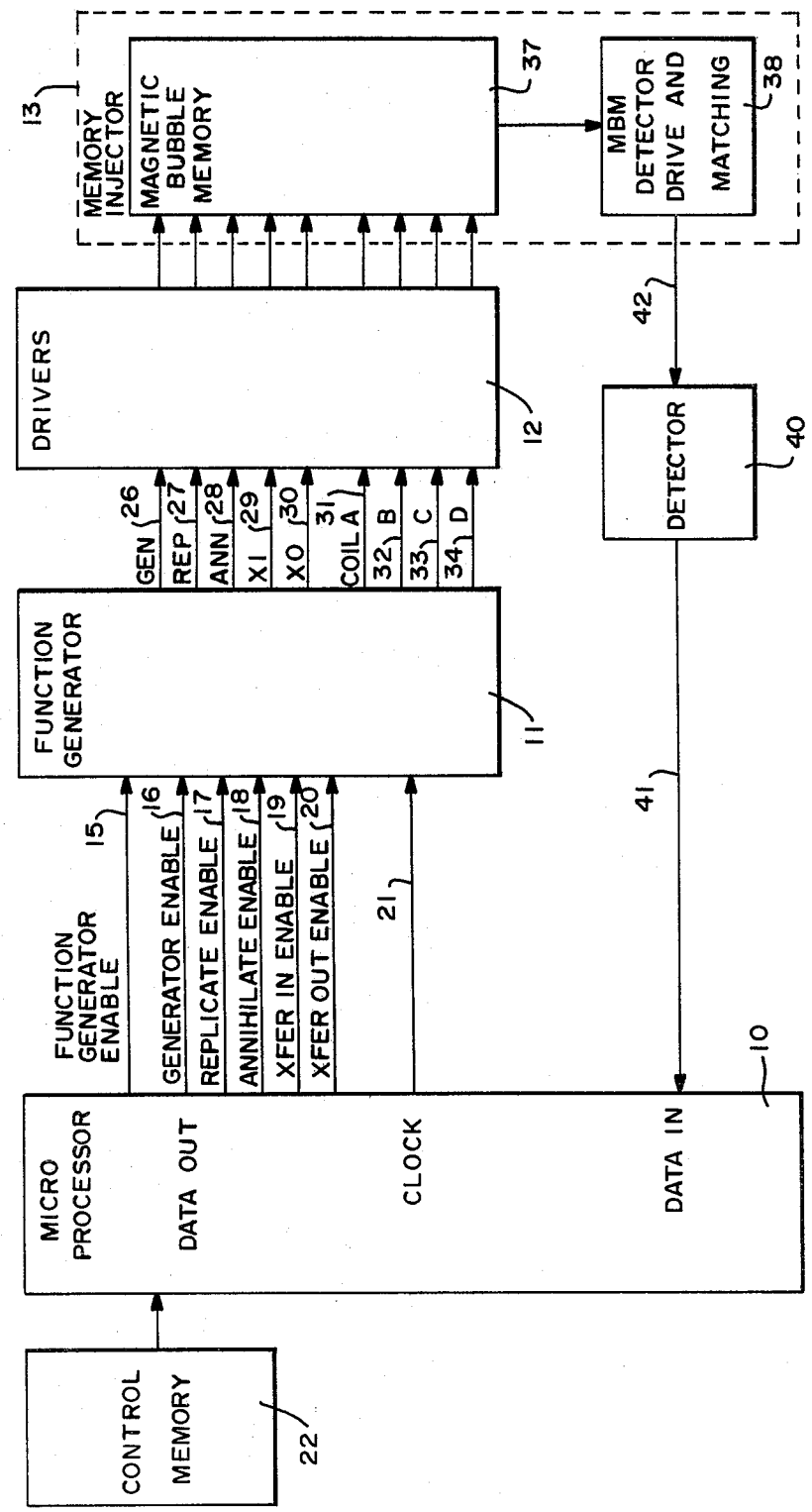
FIG.—2

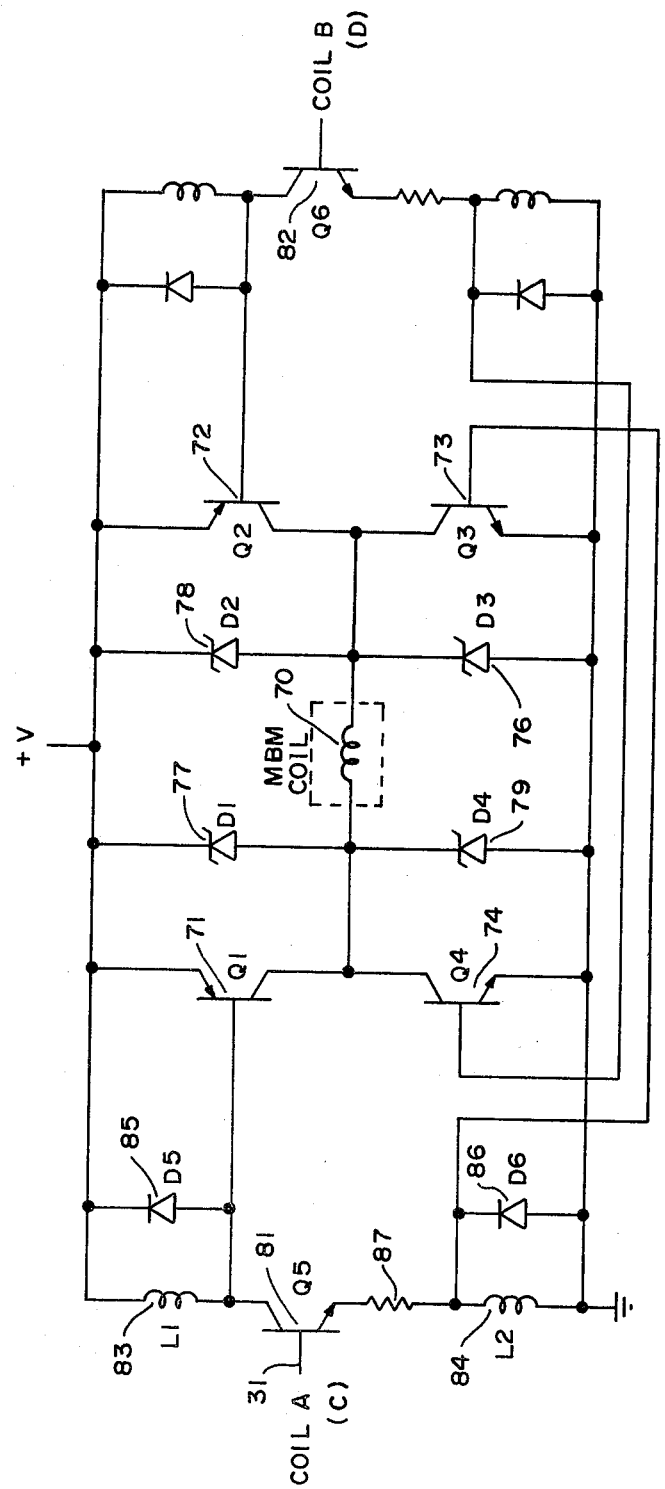
FIG.—3

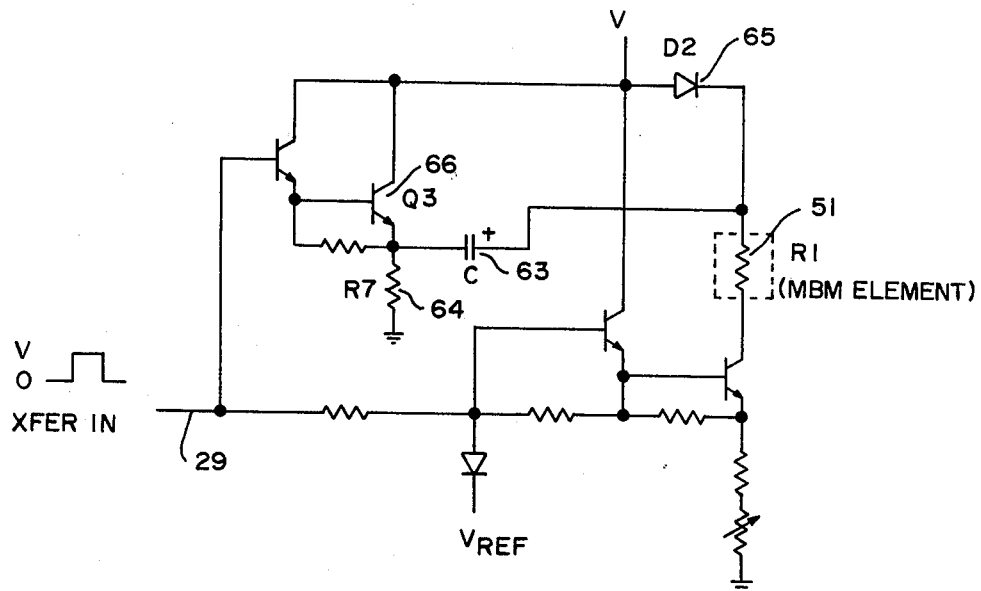
FIG.—5
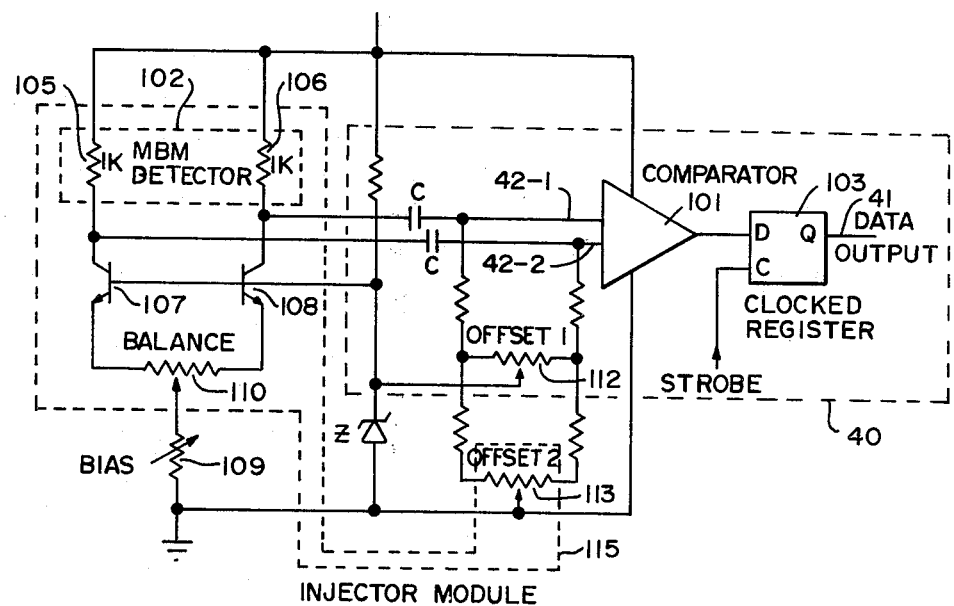
FIG.—6

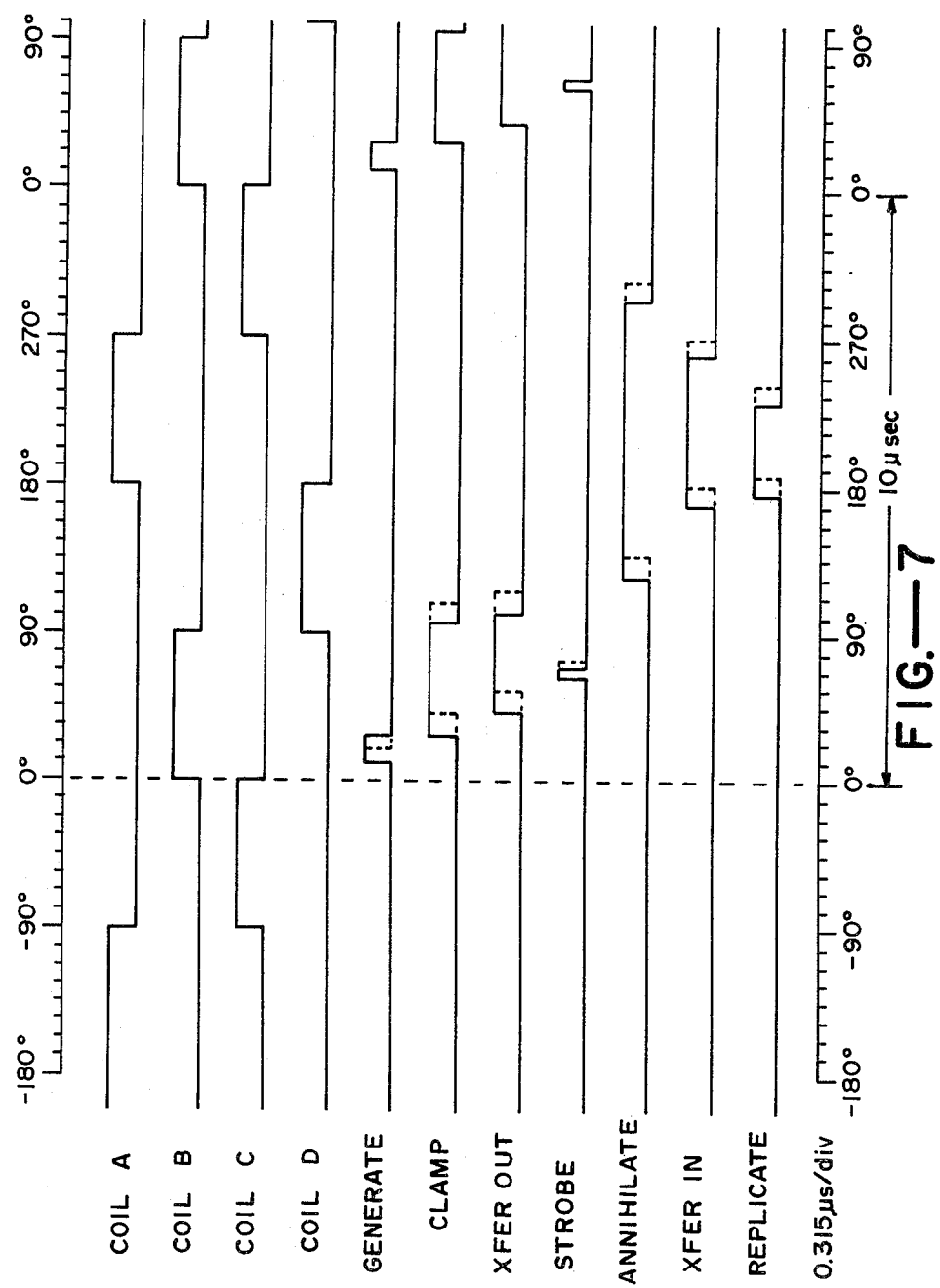
FIG.—7

INTERCHANGEABLE MAGNETIC BUBBLE MEMORY

The present invention relates to magnetic bubble memories and more particularly to an interchangeable magnetic bubble memory device.

A magnetic bubble memory is a device which stores binary data in the form of magnetic domains in a very thin sheet of garnet. Bias magnets, fixed within the device, cause the domains to be configured in microscopic cylinders, approximately five microns in diameter, with their axes perpendicular to the garnet sheet. Because of their shape, these domains are referred to as "bubbles." Generally, the presence of a bubble on the plane signifies a bit value of "1" and the absence of a bubble signifies a bit value of "0".

A cyclical pattern of soft iron is deposited on the garnet for defining the residence and motion of the bubbles on the plane. For an inactive memory device, the bubbles are stationary at sites defined by the iron pattern. Bubbles are caused to move from one site to the next by applying a rotating magnetic field such that its vector is always parallel to the garnet plane. This field is generated by applying drive currents to two orthogonal coils mounted within the device and surrounding the garnet plane. For each cycle of rotation, all bubbles advance by one site in the pattern. Typical magnetic bubble memory domains are described in U.S. Pat. No. 3,618,054, issued to Bonyhard et al. and U.S. Pat. No. 3,909,810 issued to Naden et al. In one magnetic bubble memory scheme, the bubble site pattern is organized into two loop structures comprising one major loop, containing 640 sites, and 157 "minor" loops, each containing 641 sites. Permanent storage of data occurs in the minor loops. The major loop serves to couple the minor loops to ports which interface with the outside world.

If a magnetic bubble memory were interchangeable, a user could easily interchange a memory with additional bubble memories, thereby providing more versatility. Memory capacity can be expanded and different operating programs can be entered into a terminal by simply swapping devices which would allow for portable magnetic bubble memory devices. Data and programs could be exchanged between portable terminals and other terminals without the need of interconnecting the terminals. However, in order for memories to be interchangeable, they must be electrically and operationally identical.

One problem occurring in the prior art is that a high power requirement is required by the associated memory circuitry. Because low power capacity is desirable for a portable device (so that the device could operate on battery power), memory circuitry having a low average power consumption must be used.

Another problem is the fact that prior art devices are manufactured with some of the minor loops having faulty locations, which differ between one device and the other. For example, the Texas Instrument Model TBM-0103 contains 157 minor loops, and up to 13 of these minor loops may have defective locations. Moreover, the particular defective loops differ from one memory to another and the number of defective loops also differs from one memory to another. Although manufacturers provide an error map which identifies the defective locations, these locations can and do differ between memories, a fact which also makes interchangeability difficult.

In view of the above background, the present invention achieves the objective of providing a magnetic bubble memory device appearing electrically and operationally identical to other devices, with lower power consumption regardless of the number and locations of any defective minor loops which occur in different magnetic bubble memories.

The present invention relates to magnetic bubble memories and more particularly to an interchangeable magnetic bubble memory device.

The device includes first and second interchangeable memory modules, each of the modules having magnetic bubble memory means, each having at least one major loop or non-recirculating track, where each major loop or track has a plurality of minor loops where there are no more than n defective minor loop locations specified by an error map. Matching means are provided for matching the modules such that the operation of each is electrically identical. Detector means are provided for producing data signals indicating the presence or absence of magnetic bubbles in the minor loops.

A processor provides control and enable signals for controlling the transfer of the data signals between the memory means and the processor. Driver means responsive to the control and enable signals from the processor are provided for transferring data signals between the memory means and the processor thereby allowing low power consumption of the device. Also provided are storage means for storing error map instructions for decoding the error map such that the modules can be interchanged regardless of the locations of the defective loops.

In accordance with the above summary, it is an object of the present invention to provide an interchangeable magnetic bubble memory device.

It is another object of this invention to provide a magnetic bubble memory device that has low power comsumption.

It is another object of the device to provide for an interchangeable magnetic bubble memory device regardless of the number and locations of the defective loops in different magnetic bubble memories.

Additional objects and features of the invention will appear from the description in which the preferred embodiments of the invention have been set forth in detail in conjunction with the drawings.

FIG. 1 depicts the bubble site pattern for a magnetic bubble memory.

FIG. 2 depicts a system block diagram for one embodiment of the invention.

FIG. 3 depicts a schematic representation of a coil driver circuit, which forms a portion of FIG. 2.

FIG. 4 depicts a schematic representation of a generate driver circuit, which forms a portion of FIG. 2.

FIG. 5 depicts a schematic representation of a transfer driver circuit, which forms a portion of FIG. 1.

FIG. 6 depicts a schematic representation of a bubble detector, which forms a portion of FIG. 1.

FIG. 7 depicts a timing diagram for one embodiment of the present invention.

Referring to FIG. 1, a typical bubble site pattern for a magnetic bubble memory is shown, such as for Texas Instruments Model TBM-0103. The operation of such a magnetic bubble memory is well known in the art, but will be described briefly.

In FIG. 1, the memory is organized into two loop structures, one of which is a "major" loop 43, containing 640 sites, and the other a "minor" loop, containing 157 minor loops, with each minor loop containing 641 sites. Permanent storage of data occurs in the minor loops 44 and a major loop 43 serves to couple the minor loops to ports which interface with the outside world. For other magnetic bubble memory architectures, the major loop is replaced by one or more non-recirculating tracks which serve the same function. The present invention will be described in terms of major loops, however it is to be understood that non-recirculating tracks fall within the scope of the invention.

Bubble operations are executed by applying currents of prescribed values to the device function inputs. The time durations and phases of these currents with respect to the rotating magnetic field are depicted in FIG. 7. The five timing functions are generate, transfer in, transfer out, replicate and annihilate. An illustration of the use of these functions will be described in conjunction with the description of the operations of writing data into and reading data out of the memory.

Ordinarily, data is transferred into and out from the bubble memory in blocks of 157 bits, referred to as pages. Pages are parallel transferred to the minor loops such that all bits of a given page are located at equivalent sites within the minor loops. A typical sequence for writing data into a bubble memory is as follows.

The rotating magnetic field is turned on to walk the pages to be written through the minor loop sites 44 to the transfer out position 45 of FIG. 1. A transfer out cycle such as depicted in FIG. 7 is executed to remove any bubbles of previous data from the minor loops. As the magnetic field continues to rotate, the transferred page is stepped serially around the major loop 43, and the page from which the bubbles were transferred out is stepped in parallel around the minor loops 44. When the minor loop page reaches the replicate/annihilate site 46, the annihilate function is enabled as depicted in FIG. 7 to destroy bubbles. In subsequent cycles, all data bits of the major loop page are reset to "0". As the page is stepped by the "generate" site 47, the "generate" function is enabled in FIG. 7 in sequence to produce or generate bubbles corresponding to the "1's" in the data page being input. The "0" input bits disable the generate function, so that the bubble vacancies created by the annihilate function remain in the page. In this manner, the input data page of 157 "1's" and "0's" is transferred into a major loop page of bubbles and vacancies. After a full page has been generated, the rotating field continues to step the new page through the major loop 43. When the first bit of the new page is aligned with the first minor loop, the corresponding vacant page in the minor loop has synchronously moved into the transfer sites. Execution of a "transfer" cycle, as depicted in FIG. 7, transfers the new page from major to minor loops. The data entry routine is completed by leaving the rotating field on for an additional number of cycles to walk the page to the desired location in the minor loops. At this point, all currents to the memory device are stopped and all data residing in the memory remains permanently stored at fixed locations until the next operation.

The sequence for reading data out of memory is similar to the write operation described above. The rotating field is first cycled until the page to be read is stepped through the minor loops to the transfer sites. A "transfer out" cycle moves bubbles from the minor loops to the major loop, where they propagate around the loop to the "replicate" site 46, while the vacated page propagates around the minor loops. The replicate function is enabled as the page circulates past the replicate site to divide each bubble into two bubbles. One bubble continues to propagate around the major loop, while the other bubble is shunted off to the detectors. After the prescribed delay for the replicate page to reach the detectors 48, the detector circuitry is enabled to receive the bit stream generated by bubbles or vacancies passing under the detector elements. As the replicated page passes under the detector 48 and on to the annihilation after the detector, the original page continues around the major loop 43. When the first bit of the page lines up with the first minor loop, the execution of a transfer in cycle returns the page bubbles to the minor loops.

In typical bubble memory devices, units are provided in which one or more of the minor loops are defective. An error map is supplied by the manufacturer which identifies the location of the bad or defective loops. When the input data to the bubble memory is formatted into pages by a controller, bit values of "0" are inserted between real data bits at page locations corresponding to the bad minor loops. Similarly, when bits are read from the memory, the error map must be used to delete the defective bits from each page. A typical memory such as Texas Instruments TBM-0103, which has 157 minor loops, is specified to have no more than 13 bad minor loops. Therefore, each page can contain from 144 to 157 valid data bits, depending upon the particular device, and the particular location in each memory can also vary between devices. This makes interchangeability difficult because the devices must be able to distinguish between different faulty locations between memories.

Referring now to FIG. 2, a system block diagram for one embodiment of the present invention is shown.

In FIG. 2, a microprocessor 10 is connected to a function generator 11 and provides appropriate enable and control signals via buses 15-21, enabling the function generator and driver to operate in an intermittent, power-conserving fashion. A typical microprocessor for generating necessary control signals could be an RCA 1802 CMOS, a microprocessor well known in the art.

The particular control signals on buses 15-21 for enabling the function generator 11 are identified as follows.

A function generator enable signal on bus 15 enables the function generator 11. A generator enable signal on bus 16, replicate enable signal on bus 17, annihilate enable signal on bus 18, transfer in enable signal on bus 19, and transfer out enable signal on bus 20 are provided by microprocessor 10. A clock signal on bus 21 provides necessary clocking signals for the system.

By providing appropriate enable signals, the device is able to function with significantly lower average power consumption, a feature which greatly aids in designing a portable device.

The function generator 11 is connected and provides to the driver circuit 12 the necessary input signals under control of processor 10. The input signals to driver circuit 12 appear on buses 26-34 and are identified as follows.

A generator input signal appears on bus 26, replicate signal on bus 27, annihilate signal on bus 28, transfer in (XI) on bus 29, transfer out (XO) on bus 30, coil A signal on bus 31, coil B signal on bus 32, coil C signal on bus 33 and coil D signal on bus 34.

The driver circuit 12 includes two coil driver circuits, one of which is depicted in FIG. 3. Driver 12 also includes driver circuits for the generate, replicate and annihilate functions, of which the generate driver is shown in FIG. 4. The driver 12 also includes the transfer in and transfer out drivers, of which a transfer in driver is shown in FIG. 5.

In FIG. 2, the driver circuit is connected to an interchangeable memory injector circuit 13, which includes magnetic bubble memory 37 and a magnetic bubble memory detector drive and matching circuit 38. A portion of the injector circuit 13 is shown in more detail in FIG. 6.

In FIG. 2, the injector module 13 is connected to a detector circuit 40 which inputs data into processor 10 via bus 41. Processor 10 determines the type of memory cycle to be executed as, for example, a transfer out or generate cycle, and provides the necessary delay between function executions. Data conversion to and from the page format is done by processor 10. The program of instructions for controlling the operation of the device is set forth in Appendix I, and may be stored in typical control memory 22 of FIG. 2.

Function generator 11 creates all the detailed function time intervals within a memory cycle. FIG. 7 illustrates typical time intervals and their relation to the memory cycle. To conserve battery power, function generator 11 is totally disabled when the memory 37 is not being accessed. For typical portable applications, where average data exchange rates with the memory are low, the memory interface circuit is run in a burst mode. The generator 11 is enabled long enough to transfer one page of data between the bubble memory and the microprocessor 10 memory. Although the interface circuit draws considerable power when the memory is active, the average power consumption for operating in a burst mode can be very low. To further provide low power operation, the microprocessor 10 and function generator 11 can be implemented entirely with CMOS logic devices which also enables the use of an unregulated battery power supply.

When enabled by the processor 10, the function generator 11 provides continuous chains of pulses on buses 31-34 for coils A, B, C and D, respectively, for driving the two memory coils for the bubble memory. As a result, the bubbles circulate continuously through the memory while generator 11 is enabled. However, only those function time intervals depicted in FIG. 7 and which are enabled by the processor are output by the generator 11.

The driver circuit 12 converts the generated CMOS output voltage levels to the appropriate currents required by memory 37. All driver circuits are implemented with bipolar devices to provide fast rise and fall times of approximately 50 nanoseconds and high current capability of approximately 0.5 amperes. Only one supply voltage is required and no supply current flows except for device leakage when the function generator 11 is disabled.

In FIG. 3, each of the two bubble memory field coils 70 is driven by a coil driver. The rotating magnetic field is generated by periodically reversing triangular current flowing in each coil. Linear current ramps are generated by switching transistors 71-74, driven according to FIG. 7. During the first quarter of the memory cycle, transistors 72 and 74 are saturated on, causing current through coil 70 to ramp from zero to the peak positive value. During the second quarter, all four transistors 71-74 are off. The coil current ramps from the peak value to zero through Schottky diodes 76 and 77. During the third quarter, transistors 71 and 73 are saturated, causing coil current to coil 70 to ramp up in the reverse direction from zero to the negative peak value, and during the fourth quarter all transistors 71-74 are off again, resulting in the current decaying from the negative peak value to zero through Schottky diodes 78 and 79.

The switching transistors 71-74 are driven by phase splitters 81 and 82, which are operated linearly for high speed. Using transistor 81 stage as an example, the function generator input on bus 31 for coil A causes transistor 81 to conduct, which in turn biases transistors 71 and 73 into saturation. While transistor 81 conducts, the magnetic field builds up in inductors 83 and 84. At the instant transistor 81 is switched off, these fields collapse, creating a negative bias at the bases of transistors 71 and 73 to provide a fast turnoff of 71 and 73. Diodes 85 and 86 prevent the transistors 71, 73 base-emitting junctions from zenering.

Inductors 83, 84 also provide some protection of the memory coil 70 against excessive current which would flow if transistor 81 is left on. Inductor current is limited by resistor 87, and the voltage drop across inductors 83, 84 will eventually drop to 0, shutting off the switching transistors and the memory coil current.

The coil driver circuit consumes no power when not driven by function generator 11, and only one supply voltage is required.

A basic function driver is shown in FIG. 4, which is for the generate, replicate and annihilate function. In FIG. 4, resistor 51 represents either the generate or replicate/annihilate current loops within memory device 37. Transistor 52 acts as a current source to resistor 51, the current value essentially determined by resistors 53, 54 and voltage rference source 55. Current through resistor 51 is independent of power supply voltage V, so that a battery supply can be used directly without regulation. Current regulation is achieved by creating a constant voltage reference 55 at a low power level. The input drive signal from function generator 11 on bus 26 is clipped to the reference level by resistor 57 and diode 58. Current is adjusted by resistor 54 and temperature compensation required by the memory device can be introduced through resistor 53.

Transistors 59 and 52 operate linearly, resulting in higher switching speeds than for saturated operation. Resistors 60 and 61 also improve the switching speeds.

FIG. 5 depicts a driver circuit used for transfer in and transfer out functions. It is essentially the same as the generate drivers of FIG. 4, except that a supply voltage boost circuit has been added. For supply voltages as low as 11.5 volts, the boost circuit supplies at least 20 volts to the resistor 151 circuit, which respresents the replicate/annihilate current loop within the memory device.

In FIG. 5, the boost circuit operation depends on the fact that the transfer duty cycle in less than 1%. While the transfer functions are inactive, capacitor 63 charges slowly through resistor 64 and diode 65 to the approximate voltage V. When a transfer function is active, transistor 66 saturates, causing the voltage across resistor 64 to rise to V, and consequently causing the supply voltage to resistor 51 to rise to approximately 2 V. As capacitor 63 discharges, the boosted supply voltage at resistor 51 decreases, but not enough to significantly affect the current through resistor 51.

Referring now to FIG. 6, a portion of the injector module of FIG. 2 is shown in more detail.

A portable terminal containing a magnetic bubble memory becomes more versatile if memory devices can be exchanged. Memory capacity can be expanded and different operating programs can be entered into the terminal by simply swapping devices. Data and programs can thus be exchanged between a portable terminal and other terminals without interconnecting the terminals.

In order for memories to be interchangeable, they must appear electrically and operationally identical. When using a bubble memory such as Texas Instruments TBM-0103 memory, with the low power interface circuits described above, the coil and function elements in the memory must appear identical from one device to the next. However, the memory detector elements and the locations of bad minor loops differ significantly between devices. Therefore, compensations must be made in these areas to enable interchangeability. The interchangeable package consisting of a bubble memory device and compensating devices will be referred to as the injector module.

FIG. 6 shows a detector circuit for use in an injector module for converting bubble signals to a digital output. The comparator 101 input is biased for a "0" output in the absence of a memory detector signal. When a magnetic bubble from memory 37 of FIG. 2 passes under the memory detector circuit 102, the resulting differential signal at the comparator 101 input via buses 41-1, 42-2 respectively, causes a "1" at the output. Since the comparator output is valid for only a short portion of the memory cycle, a register 103 is strobed at the appropriate time to catch and hold the data output. Data is output on bus 41 to the processor 10 of FIG. 2.

In one embodiment, the two detector elements, resistors 105, 106, are biased with a current of 5.5 ma. Two transistors 107, 108 act as current sources to provide currents to the detector elements 105, 106, which are independent of the element resistances and power supply voltage. The bias currents are adjusted by the bias variable resistor 109. Mismatches between the two detector elements 105, 106 and source transistors 107, 108 are compensated by the balance potentiometer 110. The detector circuit 102 must be balanced so that the non-bubble produced signals such as a background noise are rejected in common mode at the comparator 101 input. The detector elements are not limited to the use of resistors for detecting magnetic bubbles. For example, the detector elements could include optical sensing means rather than resistors 105, 106 to accurately detect the presence or absence of magnetic bubbles.

Comparator devices such as comparator 101 have different input offset voltages, which directly affect the threshold for detecting a bubble signal. The "offset 1" potentiometer 112 is used to standardize the threshold level for all devices. In practice it was found that adjustments must be made in the threshold level for different bubble memory devices. The "offset 2" potentiometer 113 provides this adjustment. One possible partitioning of circuitry between the terminal and injector module is indicated by the dashed lines 115. An object is to minimize the amount of circuitry in the ejector in order to minimize cost, since there might be many injectors for each terminal. Only the circuitry which compensates for differences between memory devices is located in the injector module 115.

In addition to standardizing the electrical properties of different bubble memory devices, the module 115 must also be capable of transferring to the terminal the locations of the bad minor loops. One method is to mask a ROM memory with bad loop information for each bubble memory, and locate it with the injector. This approach would significantly increase the cost of each injector 115. A better approach would be if the error map could be stored within the bubble memory itself, but retrieval is complicated by not knowing where the bad loops are in the first place. Without knowing which loops are bad beforehand, information cannot be transferred out directly, because it is highly probable some bits will be incorrect. Previous solutions to this problem have employed statistical methods of encoding the error map in different ways and storing each encodation on a different page in memory. By transferring out these pages and cross-correlating them, the error map can be extracted, but with a non-zero probability of error. The approach to be described below is non-statistical which allows transfer of the error map from memory to the terminal with complete certainty in the presence of up to 13 bit errors per page.

In one approach, the error map is encoded in approximately four pages of memory using an algorithm which depends upon knowing the maximum possible number of bad loops. To generate the error map for use by the terminal, the four pages are transferred out of the bubble memory, and transformed to the error map by a decoding algorithm resident in the terminal.

Operating programs in portable terminals must be stored in some form of non-volatile memory, so the program is retained when the power is turned off. Customarily, ROM devices are used for program storage, but have the disadvantage that they must be replaced to implement any program changes. Magnetic bubble memories are also non-volatile, and present a new opportunity for program storage.

Since data retrieval from bubble memories is much slower than from a RAM or ROM, instructions are transferred from bubble to RAM memory in large blocks, and the microprocessor can then fit its instructions from the RAM for real time execution. In this manner, many different routines can be stored in the bubble memory, and are recalled to RAM only when needed for execution. Programs can be easily changed in the field either by exchanging bubble memories, or transferring the new program into memory from an external source. Either way is cheaper and faster than replacing ROMs.

As previously described, of the 157 minor storage loops in the Texas Instruments TBM-0103 Magnetic Bubble Memory (MBM), up to 13 loops can be defective and must be avoided during data transfer operations. A 157-bit binary word, referred to as the "error map," is used to describe the locations of bad loops, with "1" signifying a bad loop and "0" a good loop. Before a bubble memory can be used, its error map must somehow be conveyed to the host system.

To save the operator the chore of keying in the error map each time the system is powdered up, it would be desirable to have the error map stored in a non-volatile memory associated with each bubble memory such as to locate each error map in a ROM memory. However, this solution is inconvenient and expensive, since at least one extra device must be added to the system with its associated interconnects, and each ROM must have a different mask corresponding to the different error maps for different bubble memories. It would be more convenient if the error map could be contained within the bubble memory itself. The map could then be transferred from the bubble memory to the host's volatile memory at each power turn-on, and the maps would automatically be changed in the host whenever bubble memories are exchanged.

The encodation of the error map is performed in three stages:

(1) Formation of a "quality" word

The error map consists of 157 bits, each of which corresponds to a minor loop. If a loop is defective, the bit value is set at "1"; otherwise, the bit is "0". The error map is partitioned into 26 groups of 6 bits each and one leftover bit. Each group has a binary "quality" value associated with it. If the group contains one or more "1's" the "quality" bit is set at "1". If the group contains all "0's" the bit is set at "0". The collection of 27 "quality" bits defines the "quality" word.

(2) Encodation of the "quality" word

One bit of information can be transferred via a bubble memory page without error and without knowledge of the error map if it is encoded in $2n+1$ page bits, where n is the maximum possible number of invalid bits in the page. If at least $n+1$ valid bits are set equal to the value of the information bit, then the information bit value can be transferred from the bubble memory by simply noting the majority value of the $2n+1$ bits. For example, if $n=13$ and the information bit value is "1", at least 14 of the 27 encodation word bits are set to "1" with 13 or less of the remaining bits (corresponding to the possibly invalid page bits) set to "0". After transfer of the encodation word from memory, at least 14 of the 27 bit values are guaranteed to be "1" i.e., the majority bit value equals "1" and the information bit value is thus known to be "1".

If only one information bit is to be encoded per memory page, as in the example above, the full 27 bits must be used for encodation. Since all 13 invalid bits can conceivably be located within the 27 bit word, there must be 14 valid bits in the word for a majority. However, if more than one information bit is encoded per memory page, advantage can be taken of the fact the sum of invalid bits for all encodations cannot exceed 13. It can be seen that not all encodations require 27 bits for a clear majority, since 13 invalid bits cannot occur in more than one non-overlapping encodation. This feature has been exploited by overlapping encodation words to effect data compression in memory. It can be shown that the 27 bit encodations can overlap each other by 13 bits (two adjacent encodations have 13 common bits) without loss of information. In this manner 10 information bits can be encoded per page (assuming a minimum of 144 valid loops). Thus, the complete 27 bit "quality" word can be encoded in less than 3 pages.

(3) Error map reorganization

A vehicle has now been created for direct storage and transfer of information, where one information bit equals one page bit. Since a maximum of 13 of the 26 groups partitioning a page can contain invalid bits, at least 13 of the groups contain all valid bits, and these groups are identified by the encoded "quality" word.

Error map storage in memory can thus be accomplished by transferring error map groups containing one or more "1's" to page groups having all valid bits. The first 6-bit error map group indicating at least one error is written on the first 6-bit page group containing all valid bits, the second error map group with at least one error is written on the second page group containing all valid bits, and so forth.

To summarize, the error map is stored in the bubble memory in two parts:

(a) The map is partitioned into 26 groups, with a maximum of 13 groups containing "1's". The groups containing "1's" are written on page groups having all valid bits, the corresponding error map groups of which contain all "0's".

(b) A "quality" word is encoded in memory to identify which map groups contain errors and which do not.

To construct the error map from information stored in memory, the "quality" word is first constructed from the 3-page encodation to provide pointers to the valid and invalid bit groups of the fourth page. The valid group words are then sequentially relocated to the invalid group sites and are replaced at the valid group sites by groups of all "0". The error map is fully reconstituted at the end of this process.

The writing of the error map into a magnetic bubble memory for the above example is performed as follows:

The error map contains a number of bits equal to the number of minor loops in the magnetic bubble memory and any defective or invalid minor loop locations are specified by a bit being set to a first state, say a "1". The valid minor loop locations are indicated by setting a corresponding bit in the error map to a second state, say a "0". The error map contains no more than n defective or invalid minor loop locations, although the precise defective locations can vary from one bubble memory to another.

Next, a quality word is formed by partitioning the error map 6 bits at a time, thereby forming 26 groups of bits where each group contains 6 bits, with no more than 13 groups containing a defective location. (For simplification a page will be considered to have 156 bits.) The quality word therefore has 26 quality bits, where any defective location in a group of bits is specified by setting the corresponding quality bit to a first state ("1").

The groups containing no defective loops are specified by setting the corresponding quality bits to the second state ("0").

If any of the bits in a particular group are invalid, the entire group of bits is stored in a first in-first out buffer (FIFO) and the corresponding quality bit of the quality word is set to the first state.

When the 26 groups of bits have been examined, each quality bit from the quality word is expanded to $n+1$ bits and each of the $n+1$ expanded bits are set to the first state for each defective loop. This process is repeated for each of the 26 quality bits from the quality words starting each expansion $n+1$ bits from the start of the previous expansion, to form an encoded quality word, and the encoded or expanded quality word is written into the magnetic bubble memory with "0's" inserted corresponding to each bad loop. In one embodiment, the encoded quality word is written into three pages of the bubble memory where the first page of the encoded quality word represents the first ten expanded quality word bits, the second page represents the next ten expanded quality word bits and the third page represents the last 6 expanded quality word bits.

The next step is to compose a fourth page in the magnetic bubble memory which identifies the locations of the defective or bad loops. This is completed as follows:

The error map is examined by looking at the first 6 bits, and if they are all equal to the second state ("0"), they are replaced with the first FIFO entry. Similarly, the remaining groups are examined in sequence with the FIFO entries replacing the group bits signified by a "0" until the FIFO is empty, thereby forming a reorganized error map of one page.

The page constructed from examining the error map is then written into the magnetic bubble memory, say at page four, and the storage of the encoded error map into the memory is completed.

In order to reconstruct the error map from the memory, assuming that the encoded quality word is stored in the first three pages and that the reorganized error map occupies page four, the sequence is as follows.

The first three pages representing the encoded quality word are read from memory and the processor looks at the first $2n+1$ bits to determine whether the majority of bits are equal to the second state ("0") or the first state ("1").

If they are in the second state ("0"), then the first bit of the quality word is set to a second state ("0"). If the majority of the $2n+1$ bits from the encoded quality word is in the first state ("1"), then the first bit of the quality word is set to the first state ("1").

The remaining bits from the encoded quality word are examined by the host processor, starting each group of $2n+1$ bits $n+1$ bits from the start of the previous groups.

A decoded quality word is thereby formed with no more than n quality bits of the quality word representing the defective locations of the minor loops.

The next step is to read the reorganized error map from the magnetic bubble memory, and examine the decoded quality word.

If quality word bit one is in the second state ("0"), then the first 6 bits from the reorganized error map are entered into a FIFO. If quality word bit 1 is in a first state ("1"), then the first group of 6 bits from the reorganized error map are ignored.

The remaining groups from the reorganized error map are examined in the same fashion and for quality word bits indiciated by a second state ("0"), the corresponding group of 6 bits are entered sequentially into the FIFO.

After completing the above, the quality word is examined again.

If the quality word bits are equal to the second state ("0"), the first 6 bits of the error map are set to zero. If the first quality word bit is in the first state ("1"), then the first 6 bits of the error map are set equal to the first 6 bit FIFO entry.

The remaining quality bits and error map groups are examined in the same fashion and, upon completion, reconstruction of the error map is complete.

What is claimed is:

1. A magnetic bubble memory device comprising: first and second interchangeable memory modules, each of said memory modules including magnetic bubble memory means having at least one major loop, each major loop having a plurality of minor loops where no more than n minor loops are defective and where the defective minor loops are specified by an error map, means for matching said modules such that the operation of each of said interchangeable memory modules are electrically identical, an encoded error map specifying said defective minor loops, and detector means for producing data signals indicating the presence or absence of magnetic bubbles in said minor loops, microprocessor means for providing control signals for controlling the transfer of data signals between said bubble memory means and said microprocessor means; driver means responsive to a control signal from said microprocessor means for transferring said data signals between said bubble memory means and said microprocessor means; and storage means for storing error map instructions for decoding said encoded error map specifying said defective minor loops such that said memory modules are interchangeable regardless of the locations of the defective minor loops in said memory means, and function generator means responsive to enable control signals from said microprocessor means for enabling operation of said device with low average power consumption.

2. A device as in claim 1 wherein said encoded error map resides within said magnetic memory means.

3. A device as in claim 1 wherein means for matching compensate for differences in matching of said detector means.

4. A device as in claim 3 wherein said driver means include transfer driver means responsive to a transfer control signal from said microprocessor means for transferring said data signals between said microprocessor means and said memory means.

5. A device as in claim 1 wherein said driver means include generate means responsive to a generate control signal from said microprocessor means for generating magnetic bubbles in specified locations in said memory means.

6. A device as in claim 1 wherein said driver means include replicate means responsive to a replicate control signal from said microprocessor means for dividing a specified one of said bubbles into two bubbles.

7. A device as in claim 1 wherein said driver means include annihilate means responsive to an annihilate control signal from said microprocessor means for destroying specified ones of said bubbles.

8. A magnetic bubble memory device comprising: first and second interchangeable memory modules, each of said memory modules including magnetic bubble memory means having at least one major loop, each major loop having a plurality of minor loops where no more than n minor loops are defective and where the defective minor loops are specified by an error map, means for matching said modules such that the operation of each of said interchangeable memory modules are electrically identical, an encoded error map specifying said defective minor loops, and detector means for producing data signals indicating the presence or absence of magnetic bubbles in said minor loops, microprocessor means for providing control signals for controlling the transfer of data signals between said bubble memory means and said microprocessor means; driver means responsive to a control signal from said microprocessor means for transferring said data signals between said bubble memory means and said microprocessor means; and storage means for storing error map instructions for decoding said encoded error map specifying said defective minor loops such that said memory modules are interchangeable regardless of the locations of the defective minor loops in said memory means, function generator means responsive to enable control signals from said microprocessor means for enabling operation of said device with low average power consumption, said detector means including comparator means biased to a first output data signal in the absence of a detected signal, first and second detector elements connected to said comparator means for producing first and second detected signals when a bubble is detecter whereby said comparator means produces a second output data signal.

9. A device as in claim 8 wherein said comparator means include first offset means for standardizing said first output signal and second offset means for adjusting said first output signal.

10. A device as in claim 8 wherein said set of page bits contains $2n+1$ bits where $n+1$ of the bits represent the value of the quality bit.

11. A device as in claim 10 wherein two adjacent sets of page bits, each encoding a different quality bit, overlap such that n page bits are shared in common by both sets.

12. A magnetic bubble memory device comprising: first and second interchangeable memory modules, each of said memory modules including magnetic bubble memory means having at least one major loop, each major loop having a plurality of minor loops where no more than n minor loops are defective and where the defective minor loops are specified by an error map, means for matching said modules such that the operation of each of said interchangeable memory modules are electrically identical, an encoded error map specifying said defective minor loops, and detector means for producing data signals indicating the presence or absence of magnetic bubbles in said minor loops, processor means for providing control signals for controlling the transfer of data signals between said bubble memory means and said processor means; driver means responsive to a control signal from said processor means for transferring said data signals between said bubble memory means and said processor means; and storage means for storing error map instructions for decoding said encoded error map specifying said defective minor loops such that said memory modules are interchangeable regardless of the locations of the defective minor loops in said memory means wherein said storage means contains an instruction set for encodation of said error map, said error map read by said processor means and written by said processor means into said memory module by dividing a page into groups, assigning a binary bit value for each page bit, the value dependent upon whether the corresponding minor loop is good or bad, transferring bits for each group containing one or more bad minor loops to a group containing no bad minor loops, assigning a binary bit value to each group containing one or more bad minor loops, and assigning the complementary bit value to each group containing no bad minor loops, the array of said bits thereby forming a quality word for identifying groups containing no bad minor loops, said groups to possibly contain maps of bad loop locations for the associated groups containing bad loops; and encoding each bit of said quality word in another set of page bits such that the value of the encoded bit is unaltered if n bits of said set are altered.

13. A device as in claim 12 wherein said set of page bits encoding a quality bit has a majority of bits representing the value of the quality bit.

14. A device as in claim 12 wherein said processor means reconstitutes the error map from said memory module by reading said sets of page bits which encode the quality word bits from said memory module, decoding said sets to reconstitute the quality word; using the quality word to locate in said memory module the group of maps indentifying the bad loop locations for the page groups containing bad minor loops; and using the quality word and said groups of maps to determine the location and bit values of the error map groups.

15. A device as in claim 14 wherein said set of page bits encoding a quality bit has a majority of bits representing the value of the quality bit.

16. A device as in claim 14 wherein said set of page bits contains $2n+1$ bits where $n+1$ of the bits represent the values of the quality bit.

17. A device as in claim 14 wherein two adjacent sets of page bits, each encoding a different quality bit, overlap such that n page bits are shared in common by both sets.

18. A portable magnetic bubble memory device comprising: magnetic memory means having at least one major loop, each major loop having a plurality of minor loops where no more than n minor loops are defective, the defective locations specified by an encoded error map for said memory means, detector means connected to said memory means for detecting the presence or absence of magnetic bubbles in said minor loop for generating data signals indicating the presence or absence of said magnetic bubbles, microprocessor means connected to receive said data signals and providing control and enable signals for controlling the transfer of data signals between said memory means and said microprocessor means, said microprocessor means including driver means responsive to said control and enable signals from said microprocessor means for transferring data signals between said memory means and said microprocessor means, storage means for storing error map instructions for enabling the decoding of said encoded error map specifying said defective minor loops such that said error map is decodable regardless of the locations of the defective minor loops in said memory means, and function generator means responsive to said control and enable signals for enabling the transfer of data between said memory means and said microprocessor means thereby enabling operation of said device with low power consumption.

19. An interchangeable magnetic bubble memory device comprising: first and second interchangeable memory modules, each of said modules including first and second magnetic bubble memory means, each of said memory means having at least one major loop where each major loop has a plurality of minor loops where no more than n minor loops are defective, the defective locations specified by an encoded error map for each of said memory means; detector means connected to one of said memory means for detecting magnetic bubbles in said minor loops thereby producing data signals; microprocessor means for providing control signals for controlling the transfer of said data signals between said memory means and said microprocessor means, said microprocessor means including a driver means responsive to a control signal from said microprocessor means for transferring said data signals between said memory means and said processor means; and storage means for storing error map instructions for decoding said encoded error map specifying said defective minor loops such that said memory modules are interchangeable regardless of the locations of the defective minor loops in said memory means wherein said storage means contains an instruction set for encodation of said error map, said error map read by said microprocessor means and written by said microprocessor means into said memory module by dividing a page into groups; assigning a binary bit value for each page bit, the value dependent upon whether the corresponding minor loop is good or bad; transferring bits for each group containing one or more bad minor loops to a group containing no bad minor loops; assigning a binary bit value to each group containing one or more bad minor loops, and assigning the complementary bit value to each group containing no bad minor loops, the array of said bits thereby forming a quality word for identifying groups containing no bad minor loops, said groups to possibly contain maps of bad loop locations for the associated groups containing bad loops; and encoding each bit of said quality word in another set of page bits such that the value of the encoded bit is unaltered if n bits of said set are altered.

20. A device as in claim 19 wherein said set of page bits encoding a quality bit has a majority of bits representing the value of the quality bit.

21. A device as in claim 19 wherein said set of page bits contains $2n+1$ bits where $n+1$ of the bits represent the value of the quality bit.

22. A device as in claim 21 wherein two adjacent sets of page bits, each encoding a different quality bit, overlap such that n page bits are shared in common by both sets.

23. A device as in claim 19 wherein said microprocessor means reconstitutes the error map from said memory module by reading said sets of page bits which encode the quality word bits from said memory module; decoding said sets to reconstitute the quality word; using the quality word to locate in said memory module the groups of maps identifying the bad loop locations for the page groups containing bad minor loops; and using the quality word and said groups of maps to determine the location and bit values of the error map groups.

24. A device as in claim 23 wherein said set of page bits encoding a quality bit has a majority of bits representing the value of the quality bit.

25. A device as in claim 23 wherein said set of page bits contains $2n+1$ bits where $n+1$ of the bits represent the value of the quality bit.

26. A device as in claim 23 wherein two adjacent sets of page bits, each encoding a different quality bit, overlap such that n page bits are shared in common by both sets.

27. An interchangeable magnetic bubble memory device comprising: first and second magnetic bubble memory means having at least one non-recirculating track, each track having a plurality of minor loops, where no more than n minor loops are defective where the defective locations are specified by an error map for each of said memory means; detector means connected to one of said memory means producing data signals indicating the presence or absence of magnetic bubbles in said minor loops; microprocessor means providing control signals for controlling the transfer of said data signals between said memory means and said microprocessor means; driver means responsive to a control signal from said microprocessor means for transferring said data signals between said memory means and said microprocessor means; and storage means for storing error map instructions for decoding said encoded error map indicating the n minor loop locations such that said memory means are interchangeable regardless of locations of the defective loops in each of said memory means and function generator means responsive to enable control signals from said microprocessor means for enabling operation of said device with lower average power consumption.

* * * * *